(12) United States Patent
Nishijima et al.

(10) Patent No.: US 7,705,375 B2
(45) Date of Patent: Apr. 27, 2010

(54) SOLID STATE IMAGING DEVICE

(75) Inventors: Kenichi Nishijima, Osaka (JP);
Toshihiro Kuriyama, Shiga (JP)

(73) Assignee: Panasonic Corporation, Osaka (JP)

( * ) Notice: Subject to any disclaimer, the term of this patent is extended or adjusted under 35 U.S.C. 154(b) by 856 days.

(21) Appl. No.: 11/584,488

(22) Filed: Oct. 23, 2006

(65) Prior Publication Data
US 2007/0182837 A1    Aug. 9, 2007

(30) Foreign Application Priority Data
Feb. 8, 2006    (JP) .............................. 2006-031253

(51) Int. Cl.
*H01L 29/00*    (2006.01)
(52) U.S. Cl. ........................ 257/233; 257/443; 257/459; 257/E31.11
(58) Field of Classification Search ................. 257/225, 257/233, 443, 459, E31.11
See application file for complete search history.

(56) References Cited

U.S. PATENT DOCUMENTS 5,502,319 A * 3/1996 Kim .............................. 257/231
6,316,814 B1 * 11/2001 Nagata et al. ................ 257/435
6,717,190 B2 * 4/2004 Shizukuishi ................. 257/232

FOREIGN PATENT DOCUMENTS

JP    08-236743    9/1996

* cited by examiner

*Primary Examiner*—Zandra Smith
*Assistant Examiner*—Christy L Novacek
(74) *Attorney, Agent, or Firm*—McDermott Will & Emery LLP

(57) ABSTRACT

A solid state imaging device includes: a plurality of photoelectric conversion portions formed in a substrate in a matrix arrangement to convert light incident on light receiving portions into electricity; a plurality of vertical transfer registers for reading charges out of the photoelectric conversion portions and transferring the charges in the column direction; and a plurality of shunt interconnections formed above the vertical transfer electrodes in one-to-one correspondence with the columns of the photoelectric conversion portions to supply drive pulses to the corresponding vertical transfer electrodes. Each of the vertical transfer registers includes a vertical transfer channel formed in the substrate in one-to-one correspondence with a column of the photoelectric conversion portions and a plurality of vertical transfer electrodes formed above the vertical transfer channel. Each of the shunt interconnections is configured to surround the light receiving portions and having windows that expose the light receiving portions.

10 Claims, 7 Drawing Sheets

SOLID STATE IMAGING DEVICE

CROSS-REFERENCE TO RELATED APPLICATION

This non-provisional application claims priority under 35 U.S.C. §119(a) of Japanese Patent Application No. 2006-031253 filed in Japan on Feb. 8, 2006, the entire contents of which are hereby incorporated by reference.

BACKGROUND OF THE INVENTION

1. Field of the Invention

The present invention relates to a solid state imaging device, in particular to a CCD (charge coupled device) solid state imaging device.

2. Description of Related Art

Demand for solid state imaging devices as imaging devices of digital still cameras and digital video cameras has been increasing in recent years. Further, in the field of mobile devices such as cellular phones, camera-equipped ones are highly demanded. From this aspect, the demand for the solid state imaging devices has been expanding more and more. The growing demand for the solid state imaging devices involves demand for enhanced image quality. In order to achieve high image quality by the solid state imaging devices, the number of pixels and the S/N ratio have to be increased.

What is required for the increase of the pixel count of a solid state imaging device is to enhance the operation speed of the solid state imaging device. In order to enhance the operation speed of a CCD solid state imaging device, it is necessary to transfer signal charges from an imaging section to a charge accumulating section at high speed.

Aiming at enhanced charge transfer speed, for example, Japanese Unexamined Patent Publication No. H8-236743 proposes a technique of forming shunt interconnections for providing drive pulses to transfer electrodes such that the electric resistance of the transfer electrodes is reduced and a delay in signal charge transfer is reduced.

FIG. 7 is an enlarged plan view of an imaging section of a conventional CCD solid state imaging device having shunt interconnections. As shown in FIG. 7, the imaging section of the conventional CCD solid state imaging device includes a plurality of photoelectric conversion portions 101 formed in a semiconductor substrate in a matrix arrangement and a plurality of vertical transfer channels 124 extending in the column direction between the photoelectric conversion portions 101 adjacent to each other in the line direction. On the vertical transfer channels 124, a plurality of vertical transfer electrodes 111 are formed to extend in the line direction. Each of the vertical transfer electrodes 111 is formed not to overlap the photoelectric conversion portions 101. On the vertical transfer electrodes 111, a plurality of shunt interconnections 114 are formed to extend along the vertical transfer channels 124. The vertical transfer electrodes 111 and the shunt interconnections 114 are insulated from each other by an interlayer insulating film. The shunt interconnections 114 are provided with protrusions 114a protruding in the line direction, respectively. Each of the protrusions 114a has a via plug 129 for electrically connecting the shunt interconnection 114 and the vertical transfer electrode 111. Parts of the photoelectric conversion portions 101 not covered with the shunt interconnections 114 and a light shield film (not shown) serve as light receiving portions.

As the vertical transfer electrodes 111 are electrically connected to the shunt interconnections 114, the electric resistance of the vertical transfer electrodes 111 is reduced and a delay in charge signal transfer is reduced. Thus, the obtained solid state imaging device is operated at high speed.

Although the conventional solid state imaging device achieves high speed operation, there are still problems such as reduction of the ratio of signal to noise (S/N ratio) and variations in sensitivity.

If the via plug for electrically connecting the shunt interconnection and the vertical transfer electrode is formed above the vertical transfer channel, work function of the vertical transfer electrode varies at a portion thereof contacting the via plug. This affects the signal charge transfer badly, e.g., some charges are not transferred properly during the transfer. For this reason, the protrusions of the shunt interconnections are indispensable.

However, when the protrusions are formed, light is reflected on the shunt interconnections irregularly and the reflected light is likely to enter the light receiving portions as stray light. Further, the reflected light is likely to enter other regions than the light receiving portions through gaps between the shunt interconnections and openings in the light shield film. If light entering from invalid regions such as gaps between on-chip lenses formed above the light receiving portions is reflected on the shunt interconnections to become stray light, the presence of the protrusions makes the occurrence of the stray light irregular. As a result, noise increases and the S/N ratio decreases, thereby increasing minimum subject illumination and decreasing effective sensitivity. Further, the light enters pixels different from the target pixel, thereby causing color mixing.

The solid state imaging device is used in combination with lenses. Therefore, light incident on the imaging section is not parallel light but the incident light is more slanted as the light approaches the periphery of the imaging section. Therefore, the sensitivity and smear gradually vary as the light approaches the periphery of the imaging section. If the shunt interconnections are shaped asymmetrically, the variations in sensitivity and smear are affected also by the angle of incident light, thereby making the variations irregular. As a result, obtained images are significantly degraded and correction to them is extremely difficult.

SUMMARY OF THE INVENTION

In order to solve the above-described problems, an object of the present invention is to provide a high image quality solid state imaging device which makes it possible to enhance the sensitivity par pixel and reduce variations in sensitivity in the imaging section.

To achieve the object, the solid state imaging device of the present invention is configured such that shunt interconnections surround the light receiving portions.

Specifically, the solid state imaging device of the present invention includes: a plurality of photoelectric conversion portions formed in a substrate in a matrix arrangement to convert light incident on light receiving portions into electricity; a plurality of vertical transfer registers for reading charges out of the photoelectric conversion portions and transferring the charges in the column direction, each of the vertical transfer registers including a vertical transfer channel formed in the substrate in one-to-one correspondence with a column of the photoelectric conversion portions and a plurality of vertical transfer electrodes formed above the vertical transfer channel; and a plurality of shunt interconnections formed above the vertical transfer electrodes in one-to-one correspondence with the columns of the photoelectric conversion portions to supply drive pulses to the corresponding vertical transfer electrodes, each of the shunt interconnections being configured to surround the light receiving portions and having windows that expose the light receiving portions.

According to the solid state imaging device of the present invention, gaps between the shunt interconnections are reduced such that the amount of stray light entering the light receiving portions is reduced. Therefore, the S/N ratio increases in each pixel and the sensitivity is enhanced. Since each of the light receiving portions is surrounded by the shunt interconnections in the same manner, variations in light entering the light receiving portions are reduced. As the variations in sensitivity in the imaging section are reduced, the solid state imaging device is achieved with high image quality.

As to the solid state imaging device of the present invention, the light receiving portions and the windows are shaped to have at least a symmetry axis along the line direction and a symmetry axis along the column direction when viewed in plan and each of the light receiving portions is concentric with the corresponding window. With this structure, the shape of the shunt interconnections surrounding the light receiving portions improves in symmetry. As a result, the variations in sensitivity in the imaging section are surely reduced.

In this case, it is preferred that the windows are rectangular-shaped when viewed in plan. Further, it is preferred that the windows are shaped to have a four-fold or more rotational symmetry when viewed in plan. In this case, it is preferred that the windows are square-shaped when viewed in plan. Alternatively, it is preferred that the windows are round-shaped when viewed in plan. This structure improves the symmetry of the windows to a further extent.

As to the solid state imaging device of the present invention, it is preferred that a boundary region between adjacent two shunt interconnections is positioned above the vertical transfer channel. With this structure, light coming through the boundary region between the shunt interconnections is prevented from entering the light receiving portions as stray light.

It is preferred that the solid state imaging device of the present invention further includes: an interlayer insulating film formed between the vertical transfer electrodes and the shunt interconnections; and a plurality of via plugs formed in the interlayer insulating film to electrically connect the vertical transfer electrodes to the corresponding shunt interconnections, wherein the via plugs are formed not to overlap the vertical transfer registers. With this structure, the work function of the vertical transfer electrodes on the vertical transfer channels is prevented from varying, thereby preventing the charge transfer from deterioration.

It is preferred that the solid state imaging device of the present invention further includes a light shield film formed between the vertical transfer electrodes and the shunt interconnections to block the entrance of light into a region of the substrate other than the light receiving portions. With this structure, stray light or reflected light is prevented from entering other regions than the light receiving portions with reliability.

It is preferred that the solid state imaging device of the present invention further includes a supplementary light shield film formed on the shunt interconnections to block the entrance of light into boundary regions between the shunt interconnections. With this structure, the thickness of layers formed on the substrate such as interlayer insulating films is reduced. As a result, on-chip lenses to be formed on the interlayer insulating film are designed with high flexibility, thereby increasing light gathering power and sensitivity.

DETAILED DESCRIPTION OF THE INVENTION

First Embodiment

Figure 1:
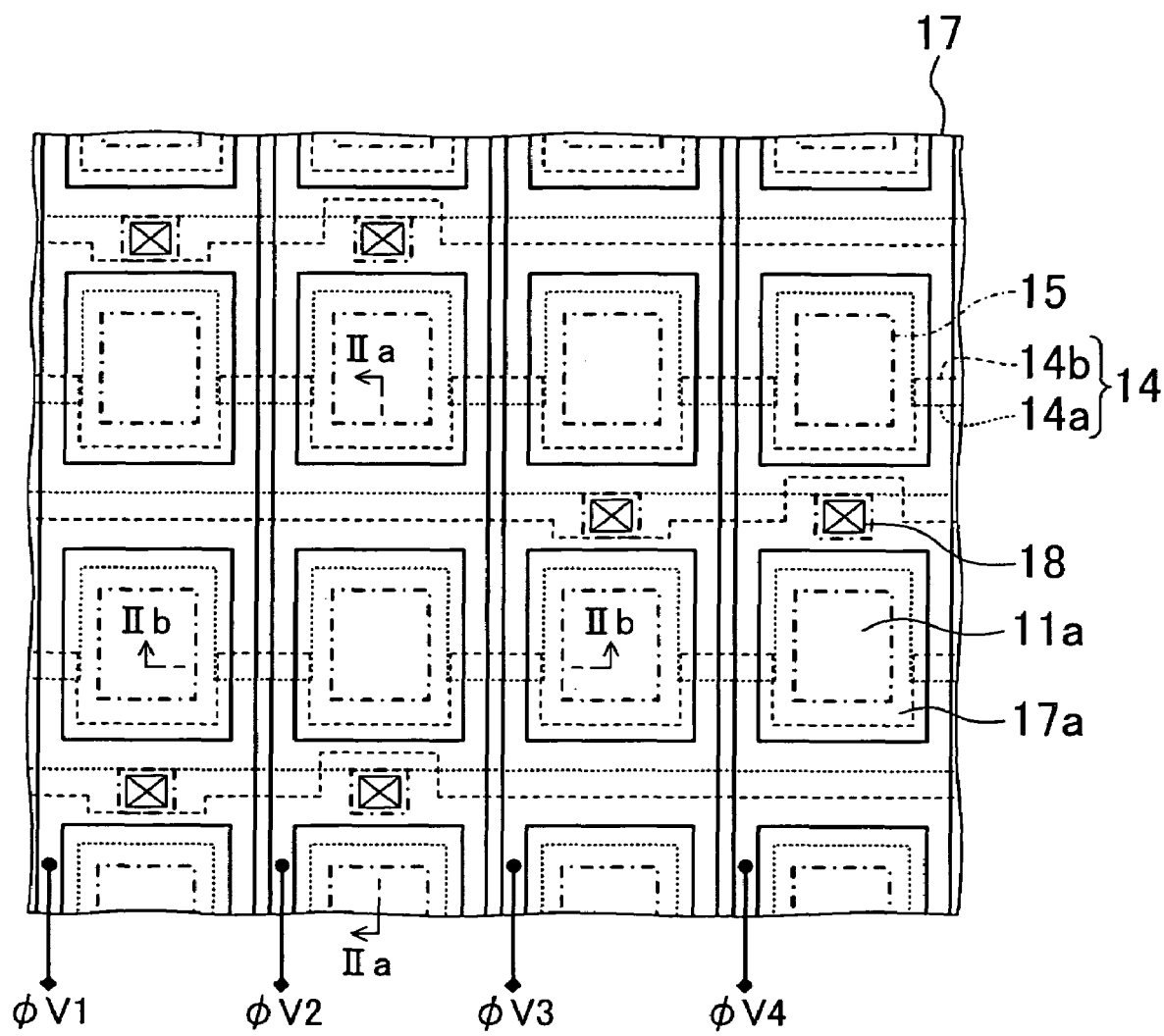
FIG. 1 is a plan view illustrating an imaging section of a solid state imaging device according to a first embodiment of the present invention.

Explanation of a first embodiment of the present invention is provided with reference to the drawings. FIG. 1 is an enlarged plan view illustrating an imaging section of a solid state imaging device according to the first embodiment and FIGS. 2A and 2B are sectional views taken along the lines IIa-IIa and IIb-IIb shown in FIG. 1, respectively.

Figure 2A:
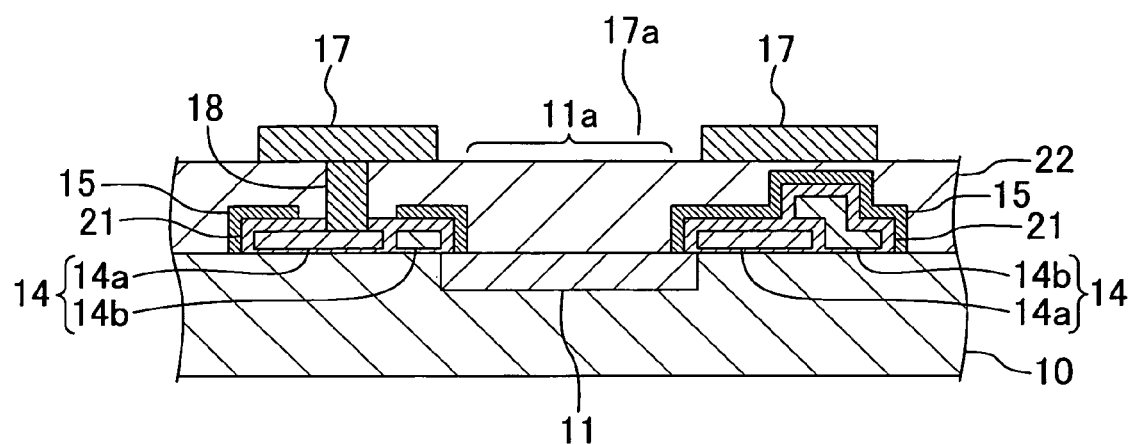
FIGS. 2A and 2B are sectional views taken along the lines IIa-IIa and IIb-IIb shown in FIG. 1, respectively, illustrating the imaging section of the solid state imaging device according to the first embodiment of the present invention.
Figure 2B:
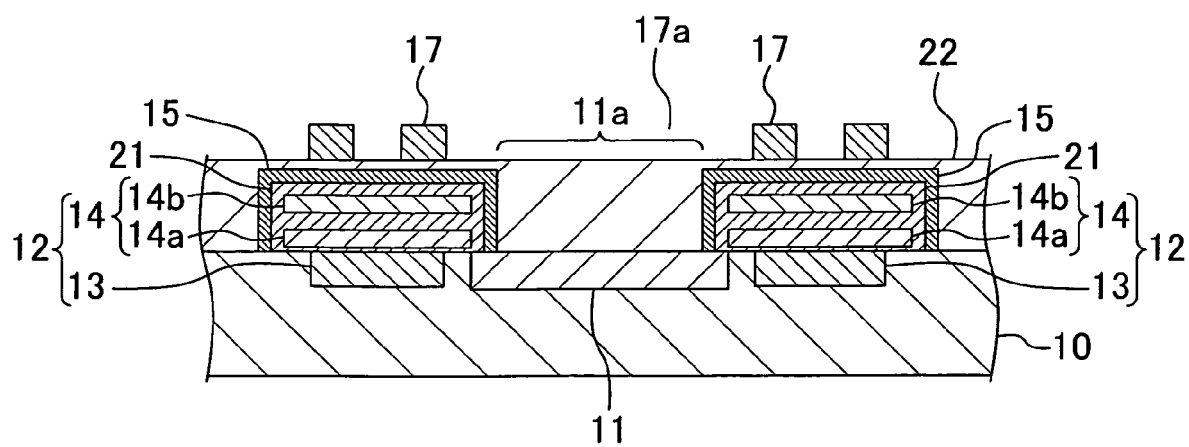

As shown in FIGS. 1, 2A and 2B, the imaging section of the solid state imaging device according to the present embodiment includes a plurality of photoelectric conversion portions 11 made of photodiodes formed in a semiconductor substrate 10 in a matrix arrangement and a plurality of vertical transfer registers 12 for reading charges out of the photoelectric conversion portions 11 and transferring the charges in the column direction.

Each of the vertical transfer registers 12 includes a vertical transfer channel 13 formed to extend in the column direction between any two photoelectric conversion portions 11 adjacent to each other in the line direction and made of an impurity diffusion layer and a plurality of vertical transfer electrodes 14 formed above the vertical transfer channel 13 to extend in the line direction and made of polysilicon. The vertical transfer electrodes 14 are consisted of first polysilicon layers 14A and second polysilicon layers 14B. The first and second polysilicon layers 14A and 14B are arranged alternately to overlap each other when viewed in plan. The vertical transfer electrodes 14 are arranged not to overlap the photoelectric conversion portions 11.

On the vertical transfer electrodes 14, a light shield film 15 made of tungsten (W) is formed with an insulating film 21 interposed therebetween. The light shield film 15 is provided with openings for exposing parts of the photoelectric conversion portions 11. The parts of the photoelectric conversion portions 11 exposed in the openings serve as light receiving portions 11a. The light shield film 15 has other openings for forming via plugs 18 to be described later.

The insulating film 21 is provided between the first polysilicon layer 14A, second polysilicon layer 14B and light shield film 15 for insulation between them.

An interlayer insulating film 22 is formed to cover the light shield film 15 and shunt interconnections 17 made of aluminum (Al) are formed on the interlayer insulating film 22 to supply drive pulses to the vertical transfer electrodes 14. The shunt interconnections 17 are arranged in one-to-one correspondence with the columns of the photoelectric conversion portions 11 along the vertical transfer channels 13. Boundary regions between the shunt interconnections 17 are positioned above the vertical transfer channels 13.

Each of the shunt interconnections 17 includes a plurality of windows 17a for exposing the light receiving portions 11a. That is, the light receiving portions 11a are surrounded by the shunt interconnections 17. When viewed in plan, the dimension of the windows 17a is the same or larger than that of the light receiving portions 11a such that light incident on the light receiving portions 11a is not blocked by the shunt interconnections 17.

Each of the shunt interconnections 17 is electrically connected to the corresponding vertical transfer electrode 14 by a via plug 18. When vertical drive pulses of different phases are applied to the shunt interconnections, the vertical transfer electrodes are driven to read charges out of the photoelectric conversion portions 11 and transfer the charges in the column direction. The solid state imaging device of the present embodiment is driven by a four-phase clock pulse of vertical transfer pulses $\phi V1$ to $\phi V4$, but this is not limitative. A solid state imaging device driven by a three-phase clock pulse, for example, may also be configured almost in the same manner as in the present embodiment.

The via plugs 18 are formed not to overlap the vertical transfer channels 13. The light shield film 15 has openings for forming the via plugs 18 therethrough. The light shield film 15 and the via plugs 18 are insulated from each other.

An upper interlayer insulating film, a color filter and on-chip lenses are formed on the shunt interconnections 17 as required. However, these components are not shown in the drawings because they are not relevant to the present invention.

In the solid state imaging device of the present embodiment, the light receiving portions 11a are surrounded by the shunt interconnections 17. The shunt interconnections 17 made of metal such as Al prevent unwanted stray light from entering other regions than the light receiving portions 11a just like the light shield film 15. Since the shunt interconnections 17 are formed continuously in the column direction so as not to generate gaps near the light receiving portions 11a which allow the entrance or reflection of stray light, the influence of the stray light is reduced. This improves the S/N ratio of the solid state imaging device.

In the solid state imaging device of the present embodiment, each of the windows 17a and each of the light receiving portions 11a are both square-shaped and concentric when viewed in plan. That is, the shape of the window 17a is symmetric about the center of the light receiving portion 11a. Therefore, the degrees of the effect of light reflected from the shunt interconnections 17 on the light receiving portions 11a are equalized. Likewise, the degrees of the effect of stray light on the light receiving portions 11a are also equalized. As the degree of the effect of the reflected light and that of the stray light are made uniform throughout the imaging section, the S/N ratio is less varied in the imaging section. Further, since the light receiving portions 11a are uniformly affected by the stray light, it is easy to correct the effect of the stray light and take measures to block the stray light.

As the shunt interconnections 17 are shaped to have symmetry, sensitivity is not significantly varied and smear is less likely to occur even if the angle of incident light varies. Therefore, the variations in sensitivity are reduced and smear is less likely to occur in the imaging section.

In this case, the light receiving portion 11a and the window 17a are preferably shaped to have at least a symmetry axis along the line direction and a symmetry axis along the column direction when viewed in plan. With this structure, light equally enters at least pixels equidistant from the center of the imaging section. Therefore, the variations in sensitivity are reduced and smear is less likely to occur in the imaging section. If the light receiving portions 11a and the windows 17a are shaped to have a four-fold rotational symmetry when viewed in plan, e.g., square-shaped, the degree of symmetry of the shape of the shunt interconnections 17 increases, thereby reducing the variations to a further extent.

Figure 3:
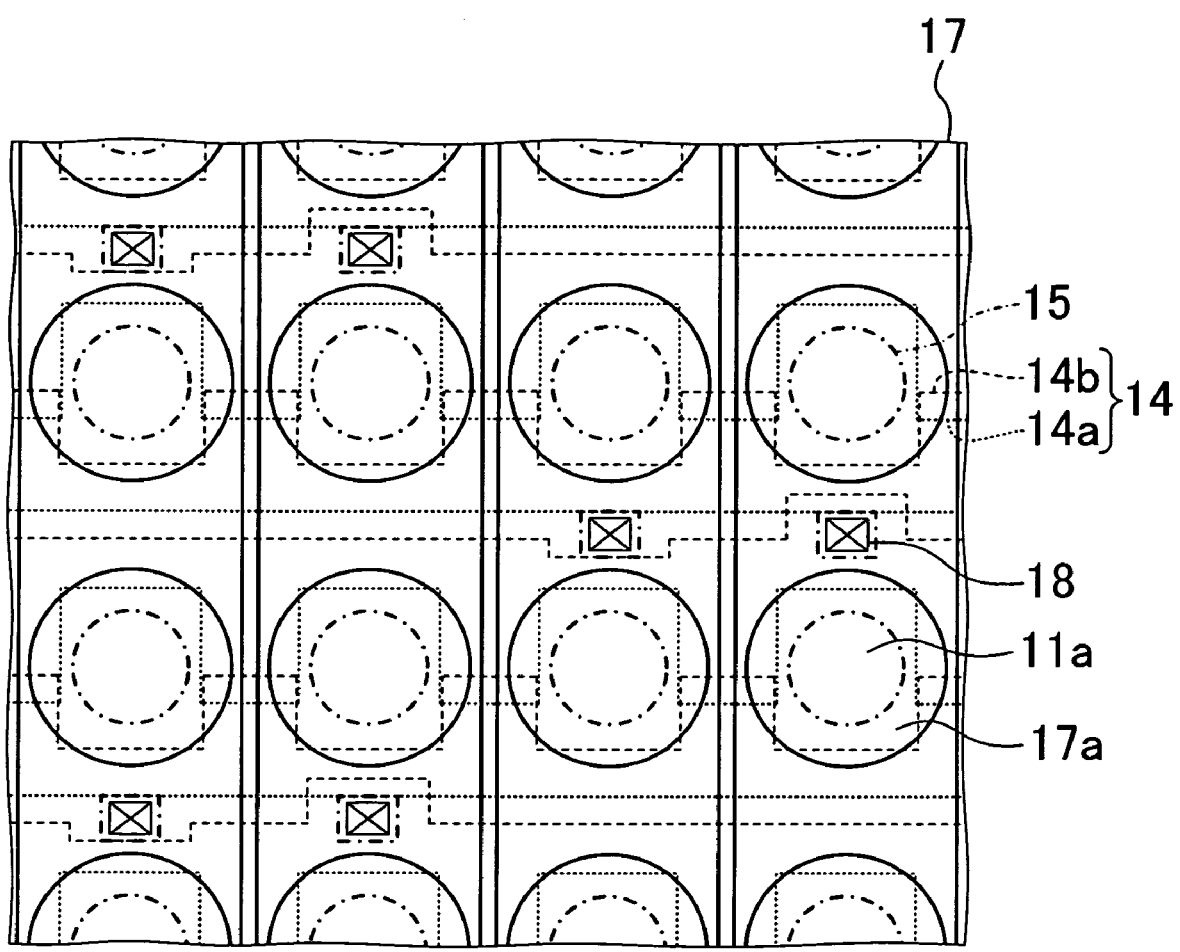
FIG. 3 is a plan view illustrating an imaging section of a solid state imaging device according to a modification of the first embodiment of the present invention.

From the aspect of symmetry, it is preferred that both of the light receiving portions 11a and the windows 17a of the shunt interconnections 17 are round-shaped when viewed in plan as shown in FIG. 3. In this case, the symmetry of the shape of the shunt interconnections 17 is enhanced to the maximum, thereby reducing the effect of the angle of incident light. The openings formed in the light shield film 15 for exposing the photoelectric conversion portions 11 may be square-shaped and the windows 17a of the shunt interconnections 17 may be round-shaped. With this structure, the symmetry of the shape of the shunt interconnections 17 improves without decreasing the aperture ratio of the solid state imaging device.

Figure 4:
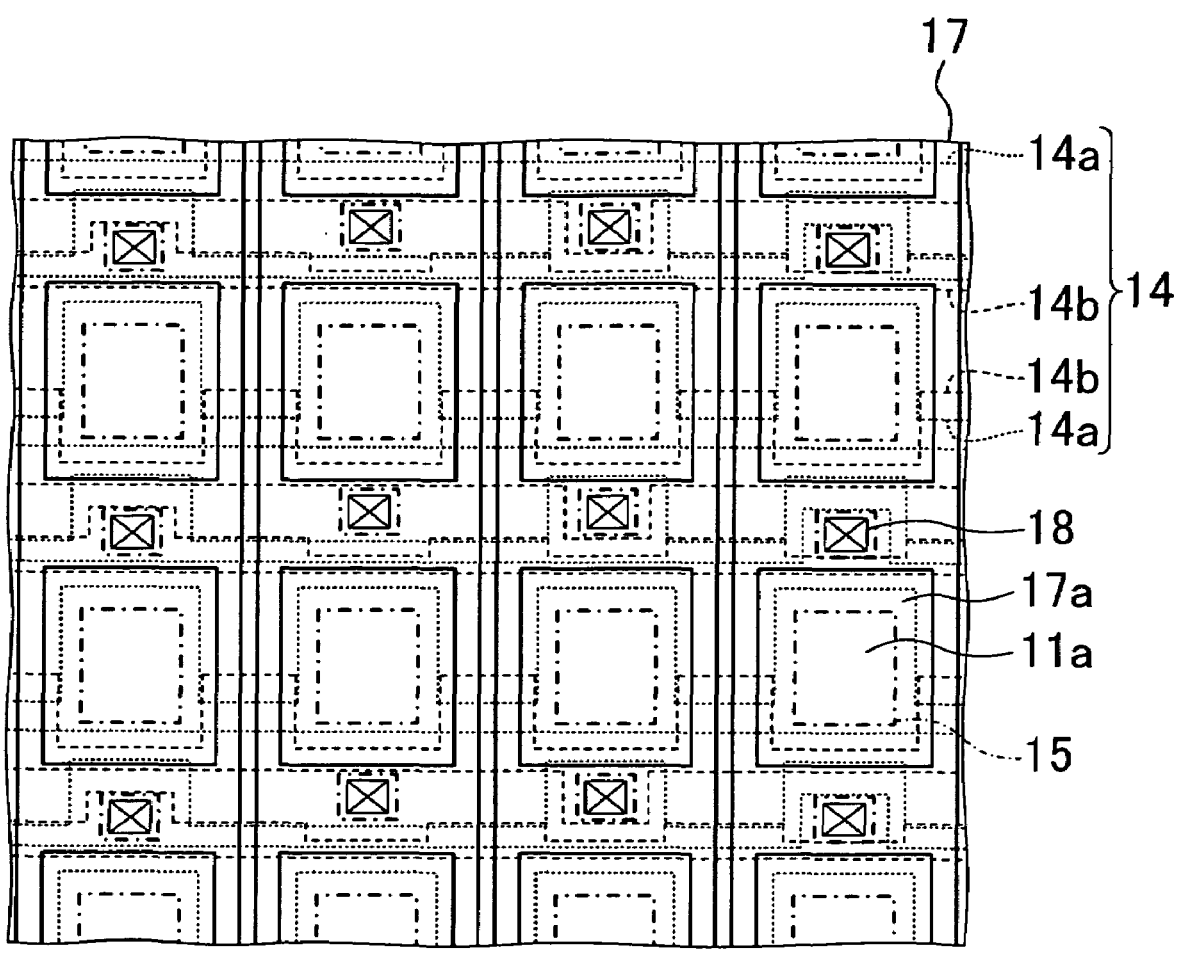
FIG. 4 is a plan view illustrating an imaging section of a solid state imaging device according to a modification of the first embodiment of the present invention.

As shown in FIG. 4, the structure of the present embodiment may be applied to a progressive scanning solid state imaging device. In this case, four independent vertical transfer electrodes are required for a single photoelectric conversion portion. Therefore, the number of via plugs for electrically connecting the shunt interconnections and the vertical transfer electrodes increases. However, since the shunt interconnections are configured to surround the light receiving portions, there is no need of changing the pattern of the shunt interconnections.

Second Embodiment

Figure 5:
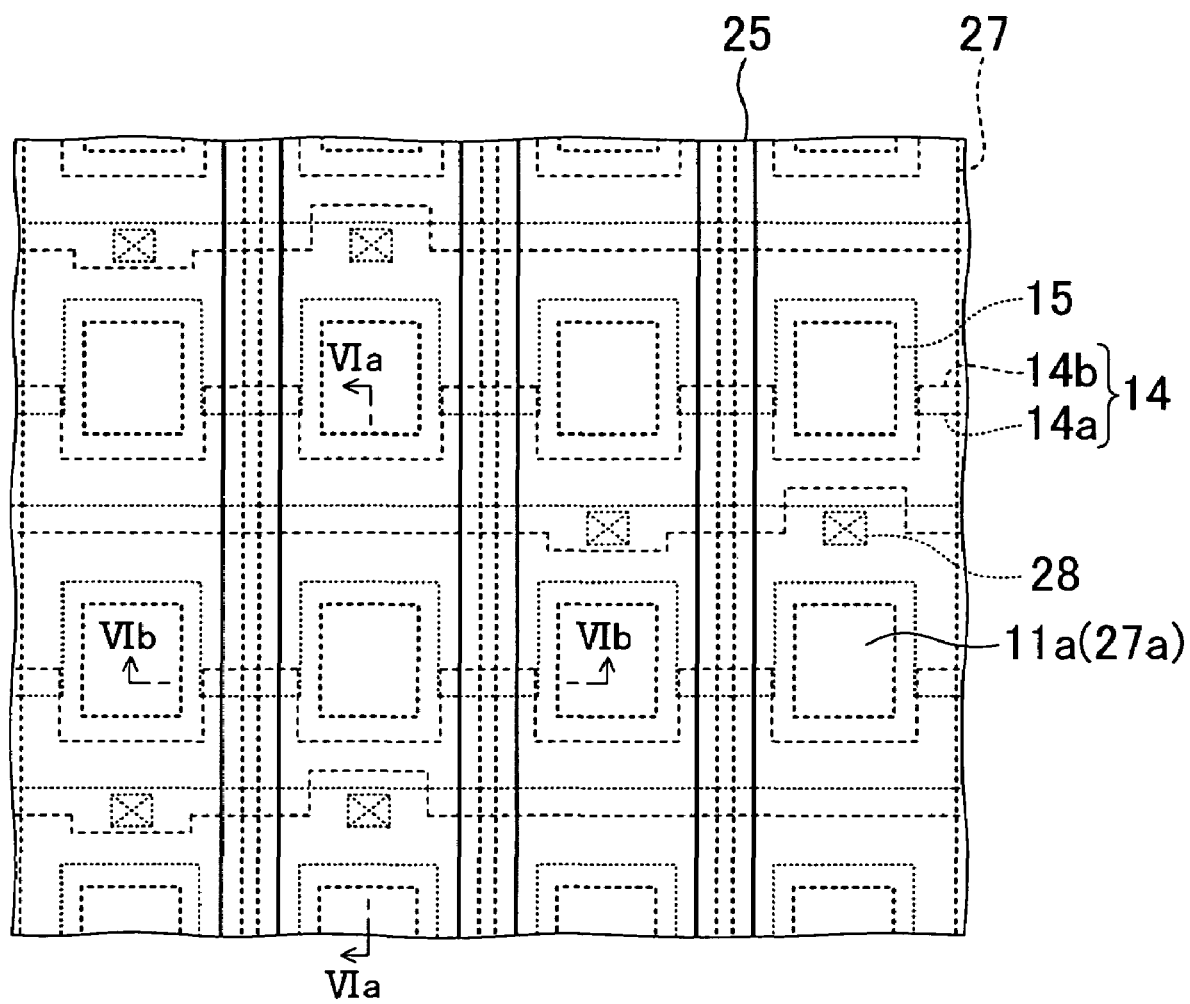
FIG. 5 is a plan view illustrating an imaging section of a solid state imaging device according to a second embodiment of the present invention.
Figure 6A:
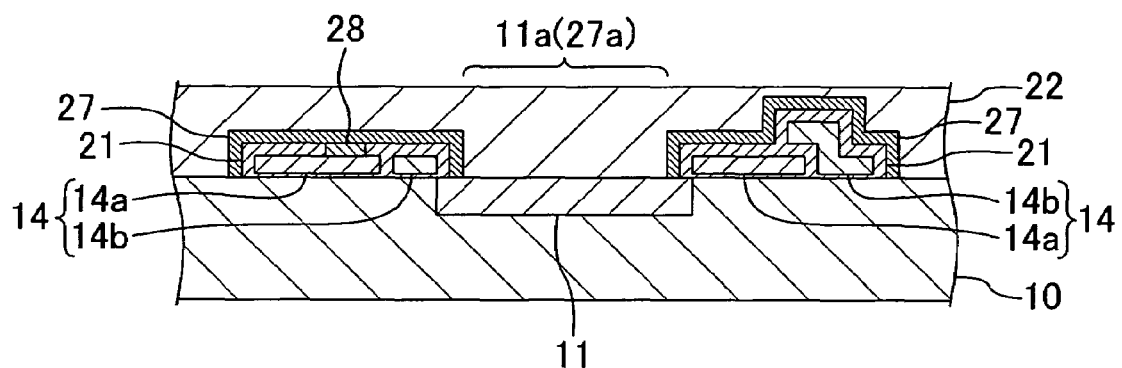
FIGS. 6A and 6B are sectional views taken along the lines VIa-VIa and VIb-VIb shown in FIG. 5, respectively, illustrating the imaging section of the solid state imaging device according to the second embodiment of the present invention.
Figure 6B:
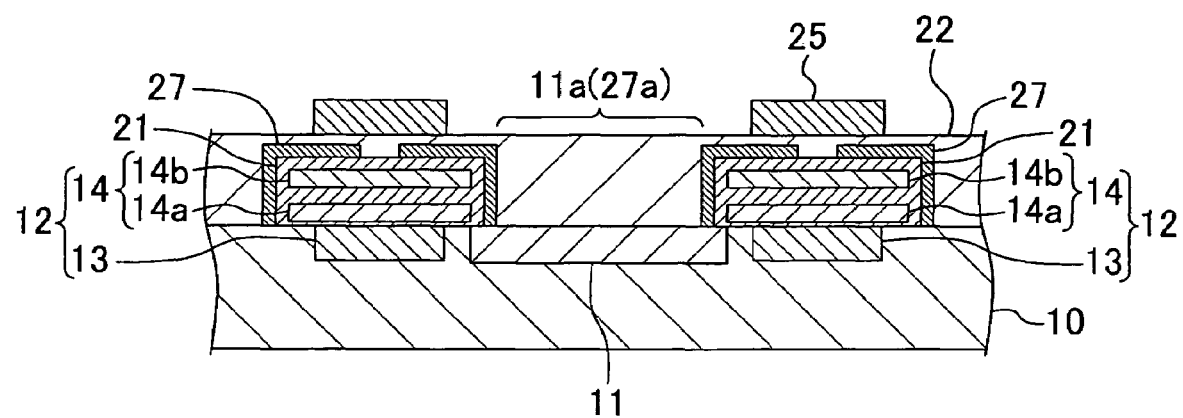
Figure 7:
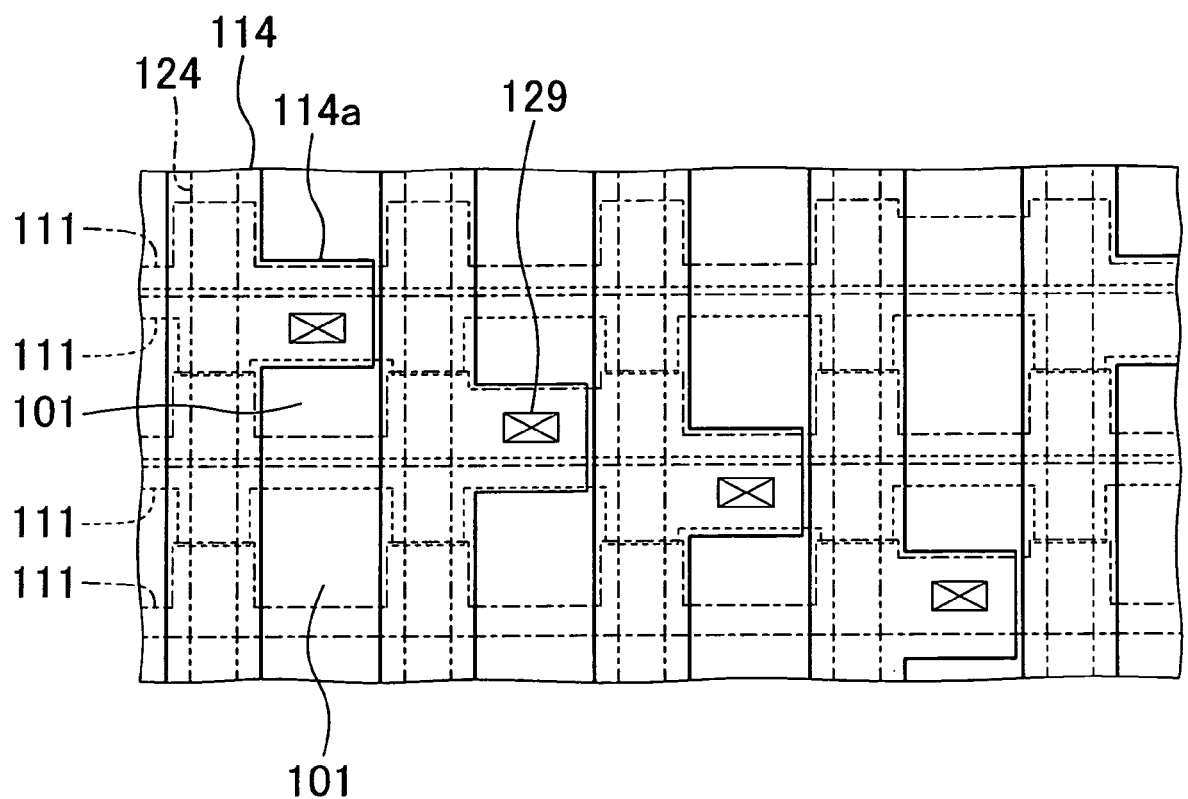
FIG. 7 is a plan view illustrating an imaging section of a conventional solid state imaging device.

Hereinafter, explanation of a second embodiment of the present invention is provided with reference to the drawings. FIG. 5 is an enlarged plan view illustrating an imaging section of a solid state imaging device according to the second embodiment. FIGS. 6A and 6B are sectional views taken along the lines VIa-VIa and VIb-VIb shown in FIG. 5, respectively. In FIGS. 5, 6A and 6B, the same components as those shown in FIGS. 1, 2A and 2B are indicated by the same reference numerals to omit explanation.

In the solid state imaging device of the present embodiment, shunt interconnections 27 serving also as a light shield film are formed on the vertical transfer electrodes 14 with an insulating film 21 interposed therebetween. The shunt interconnections 27 are arranged in one-to-one correspondence with the columns of the photoelectric conversion portions 11a just like the shut interconnections 17 of the first embodiment and provided with windows 27a for exposing the light receiving portions 11a. Boundary regions between the shunt interconnections 27 are positioned above the vertical transfer channels 13. Each of the shunt interconnections 27 is electrically connected to the corresponding vertical transfer electrode 14 through a via plug 18 formed in the insulating film 21.

An interlayer insulating film 22 is formed over the imaging section to cover the shunt interconnections 27 and a supplementary light shield film 25 is formed on the interlayer insulating film 22. The supplementary light shield film 25 is formed above the boundary regions between the shunt interconnections 27 to prevent light from entering the substrate through the boundary regions. Any material may be used as the supplementary light shield film 25 as long as it blocks light. For example, metal or a black filter may be used.

An upper interlayer insulating film, a color filter and on-chip lenses are formed on the supplementary light shield film 25 as required. However, these components are not shown in the drawings because they are not relevant to the present invention.

In the solid state imaging device of the present embodiment, the shunt interconnections 27 serve also as a light shield film. Therefore, as compared with the case where the light shield film and the shunt interconnections are both formed, the thickness of the layers to be formed on the substrate is reduced. Therefore, improved flexibility is given to the optical design. To be more specific, the shape of the on-chip lenses is optimized. This makes it possible to increase light gathering power and sensitivity.

According to the solid state imaging device of the present application, the S/N ratio is high and the sensitivity is less varied in the imaging section. Therefore, with use of the solid state imaging device of the present application, high image quality digital still cameras and digital video cameras are achieved while the sensitivity is enhanced and unevenness of image is reduced.

Thus, as described above, the present invention makes it possible to realize a high image quality solid state imaging device with high sensitivity par pixel and reduced variations in sensitivity in the imaging section. The present invention is particularly useful for CCD solid state imaging devices.

What is claimed is:

1. A solid state imaging device comprising:
   a plurality of photoelectric conversion portions formed in a substrate in a matrix arrangement to convert light incident on light receiving portions into electricity;
   a plurality of vertical transfer registers for reading charges out of the photoelectric conversion portions and transferring the charges in the column direction, each of the vertical transfer registers including a vertical transfer channel formed in the substrate in one-to-one correspondence with a column of the photoelectric conversion portions and a plurality of vertical transfer electrodes formed above the vertical transfer channel; and
   a plurality of shunt interconnections formed above the vertical transfer electrodes in one-to-one correspondence with the columns of the photoelectric conversion portions to supply drive pulses to the corresponding vertical transfer electrodes, each of the shunt interconnections being configured to surround the light receiving portions and having windows that expose the light receiving portions.

2. The solid state imaging device of claim 1, wherein
   a boundary region between adjacent two shunt interconnections is positioned above the vertical transfer channel.

3. The solid state imaging device of claim 1 further comprising:
   an interlayer insulating film formed between the vertical transfer electrodes and the shunt interconnections; and
   a plurality of via plugs formed in the interlayer insulating film to electrically connect the vertical transfer electrodes to the corresponding shunt interconnections, wherein
   the via plugs are formed not to overlap the vertical transfer registers.

4. The solid state imaging device of claim 1 further comprising:
   a light shield film formed between the vertical transfer electrodes and the shunt interconnections to block the entrance of light into a region of the substrate other than the light receiving portions.

5. The solid state imaging device of claim 1 further comprising:
   a supplementary light shield film formed on the shunt interconnections to block the entrance of light into boundary regions between the shunt interconnections.

6. The solid state imaging device of claim 1, wherein
   the light receiving portions and the windows are shaped to have at least a symmetry axis along the line direction and a symmetry axis along the column direction when viewed in plan and
   each of the light receiving portions is concentric with the corresponding window.

7. The solid state imaging device of claim 6, wherein
   the windows are rectangular-shaped when viewed in plan.

8. The solid state imaging device of claim 6, wherein
   the windows are shaped to have a four-fold or more rotational symmetry when viewed in plan.

9. The solid state imaging device of claim 8, wherein
   the windows are square-shaped when viewed in plan.

10. The solid state imaging device of claim 8, wherein
    the windows are round-shaped when viewed in plan.

* * * * *